United States Patent
Frisa et al.

[11] Patent Number: 6,028,003
[45] Date of Patent: Feb. 22, 2000

[54] METHOD OF FORMING AN INTERCONNECT STRUCTURE WITH A GRADED COMPOSITION USING A NITRIDED TARGET

[75] Inventors: Larry E. Frisa, Cedar Park; Hak-Lay Chuang, Austin, both of Tex.

[73] Assignee: Motorola, Inc., Schaumburg, Ill.

[21] Appl. No.: 08/887,654

[22] Filed: Jul. 3, 1997

[51] Int. Cl.[7] .................................................. H01L 49/00
[52] U.S. Cl. ..................... 438/653; 438/656; 438/688; 204/192.15
[58] Field of Search .................................. 438/652, 656, 438/678, 648, 658, 685, 653, 654; 204/192.1, 192.15

[56] References Cited

U.S. PATENT DOCUMENTS

| | | | |
|---|---|---|---|
| 5,231,053 | 7/1993 | Bost et al. | 437/190 |
| 5,289,035 | 2/1994 | Bost et al. | 257/750 |
| 5,317,187 | 5/1994 | Hindman et al. | 257/659 |

*Primary Examiner*—Wael M. Fahmy
*Assistant Examiner*—Kurt Eaton
*Attorney, Agent, or Firm*—Keith E. Witek

[57] ABSTRACT

A method for forming an interconnect structure on a semiconductor wafer (114) begins by placing the wafer (114) in a process chamber (100). The process chamber (100) contains a titanium (Ti) target (102) having a thin titanium nitride (TiN) layer (104) formed thereon. An argon-based plasma (106) is used to sputter the layer (104) off of the target (102) and onto a top surface of the wafer (114) to form an Argon Uniquely Sputtered Titanium Nitride (AUSTiN) layer (116) which has a nitrogen concentration gradient therethrough. After forming the layer (116), an argon-nitrogen plasma (107) is initiated to reform the titanium nitride (TiN) layer (104) on the target and complete the interconnect structure by forming a top stoichiometric or near stoichiometric titanium nitride layer (118) over the layer (116).

21 Claims, 8 Drawing Sheets

METHOD OF FORMING AN INTERCONNECT STRUCTURE WITH A GRADED COMPOSITION USING A NITRIDED TARGET

FIELD OF THE INVENTION

The present invention relates generally to semiconductor manufacturing, and more particularly to, forming an aluminum, nonstoichiometric titanium nitride (TiN$_x$), and stoichiometric titanium nitride (TiN) composite integrated circuit (IC) interconnect.

BACKGROUND OF THE INVENTION

The integrated circuit (IC) industry is continually striving to manufacture metallic interconnect structures which have improved reliability and performance. FIG. 1 illustrates an interconnect structure which has been utilized in the prior art. In FIG. 1, a titanium (Ti) layer 20 is first deposited. After formation of the titanium (Ti) layer 20, a titanium nitride (TiN) layer 22 is then formed on top of the layer 20. The bulk of the metallic interconnect is then formed overlying the layer 22 by depositing a thick aluminum or aluminum alloy (Al) layer 24. On top of this thick aluminum (Al) layer 24 is deposited a thin titanium nitride (TiN) layer 26 which is utilized as an anti-reflective coating (ARC) layer for the prior art structure.

Typically, the interconnect of FIG. 1 is covered with a dielectric layer (not illustrated in FIG. 1) which is then photo-lithographically patterned and etched to form via/contact openings (not illustrated in FIG. 1) through the dielectric layer. These via/contact openings will expose layer 26, reactive ion etch (RIE) through the layer 26, and expose a top contact portion of the aluminum (Al) layer 24. These via/contact openings typically have high aspect ratios wherein the diameter of these via/contact openings will typically be less than 0.8 microns and the depth of these vias/contacts may be greater than 1.0 micron. Due to the fact that the aluminum layer 24 has now been exposed by the RIE process, additional barrier layers must now be deposited to protect the aluminum layer 24 in FIG. 1 from subsequent tungsten deposition processing. In the prior art process of FIG. 1, the via/contact opening is coated with titanium (Ti) and then titanium nitride (TiN). As is known in the art, deposition of these materials into high aspect ratio contacts is complicated and problematic. The proper amount of protective barrier material is not always formed at the bottom of via/contact openings. This problem is only exacerbated as aspect ratio of contacts and vias continue to increase. Therefore, the need exists for a process wherein subsequently deposited barrier layers within large aspect ratio via/contacts are no longer needed.

Due to the barrier limitations of FIG. 1, the IC industry began to use an interconnect metallic structure as illustrated in FIG. 2. FIG. 2 illustrates that a thick aluminum (Al), or aluminum alloy layer 28 is first formed. A titanium (Ti) layer 30 is then deposited over a top of the layer 28. It is important to note that a titanium aluminide (Al$_3$Ti) is formed at the interface between the titanium layer 30 and the aluminum layer 28 of FIG. 2 after an anneal step. This Al$_3$Ti layer is disadvantageous because copper (Cu), which is typically used to form an aluminum-copper (Al—Cu) alloy as the aluminum layer 28 to improve in electromigration reliability, will diffuse along the Al$_3$Ti interface resulting in reduced electromigration reliability for the aluminum in the layer 28. After formation of the titanium (Ti) layer 30 in FIG. 2, a titanium nitride (TiN) layer 32 is deposited over the layer 30.

In a manner similar to FIG. 1, a dielectric layer is then deposited over the structure of FIG. 2 and via/contact openings are etched to expose the layer 32 of FIG. 2. It is important to note that the etch chemistries used to expose the layer 32 may etch through the layer 32 thereby exposing the titanium (Ti) layer 30 of FIG. 2. If the titanium layer 30 is exposed, subsequent tungsten (W) processing which utilizes tungsten fluoride (WF$_6$) will result in an adverse reaction of the titanium layer 30 due to presence of fluorine. Therefore, the inclusion of titanium near the surfaces of any interconnect structure is not advantageous when tungsten fluoride processing is utilized to form W plugs. Therefore, a need exists for an interconnect process which reduces or eliminates the presence of titanium (Ti) in the final interconnect structure and reduces or eliminates the formation of electromigration-degrading Al$_3$Ti within the interconnect structure.

FIG. 3 illustrates yet another interconnect structure which may be used in the integrated circuit (IC) industry. FIG. 3 illustrates a structure which begins by depositing an aluminum or aluminum alloy layer 34. A titanium nitride (TiN) layer 36 is then deposited over the aluminum (Al) layer 34. It is important to note that in the formation of the titanium nitride (TiN) layer 36, nitrogen will react with the aluminum layer 34 to form a thin, and highly resistive, aluminum nitride (AlN) layer between the titanium nitride layer 36 and the aluminum layer 34. The thin and highly resistive aluminum nitride (AlN) layer between the layers 34 and 36 will adversely affect via/contact resistance of the structure of FIG. 3. Therefore, the formation of aluminum nitride (AlN) within an interconnect structure is disadvantageous and should be avoided in semiconductor interconnect technology. After formation of the layer 36, a thick titanium (Ti) layer 38 is deposited. Over a top of the titanium layer 38 is deposited a titanium nitride (TiN) layer 40. It is important to note that the WF$_6$ processing that is used to form tungsten (W) plugs above the structure of FIG. 3 is also disadvantageous in a manner similar to that discussed previously for FIG. 2 due to the large presence of unreacted titanium (Ti) in layer 38. Therefore, AlN and large areas of unreacted Ti should be avoided in interconnect structures if possible.

In addition to the prior art illustrated in FIGS. 1–3, it is generally known that it is disadvantageous in the IC industry to utilize titanium nitride (TiN) targets to perform sputtering of titanium nitride layers in interconnect structures. Titanium nitride targets result in severe particulate problems within processing chambers, and the Ti to N ratio varies throughout a titanium nitride (TiN) target whereby subsequently deposited TiN layers suffer from nitrogen concentration variations. Therefore, newer generations of interconnect structures should avoid the use of a titanium nitride (TiN) sputter target in sputtering or deposition chambers.

Generally, the devices of FIGS. 1–3, utilize multiple chambers (e.g. some use three or four processing chambers) in order to form a single composite interconnect layer. It is well known that the fewer chambers which are utilized in processing results in a decrease in material defectivity. Therefore, it is possible to increase IC yield by reducing the number of chambers through which interconnect structures must be processed. Furthermore, if fewer wafer chambers can be used and no shutters or dummy wafers need to be utilized, then the throughput of the interconnect deposition system can be improved in the manufacture of an interconnect structure for a semiconductor device. Improved throughput reduces cost, improves cycle time and is always advantageous in the integrated circuit industry.

In addition, while the devices of FIGS. 1–3 are adequate in terms of electromigration, the electromigration reliability of the devices of FIGS. 1–3 are marginal by today's standards and may be approaching theoretical limits. Therefore, the need for an interconnect structure which has improved electromigration reliability is desired. Furthermore, any interconnect structure which can reduce wafer stress and reduce via/contact resistance is also advantageous in the IC arts.

Therefore, the need exists in the IC art for an interconnect structure which accomplishes one or more of the following: (1) eliminate the need for barriers deposited within high aspect ratio contacts/vias; (2) avoid the need for a composite titanium nitride (TiN) sputter targets; (3) reduce or eliminate titanium material in the interconnect structure for more compatibility with tungsten $WF_6$ processing; (4) reduce or eliminate aluminum nitride (AlN) formation to reduce resistivity and improve via/contact resistance; (5) reduce or eliminate titanium aluminide ($Al_3Ti$) formation to reduce film stress; (6) improve overall electromigration reliability; (7) increase the throughput of deposition/sputtering systems; and (8) improve yield due to reduced wafer handling.

Figure 1:
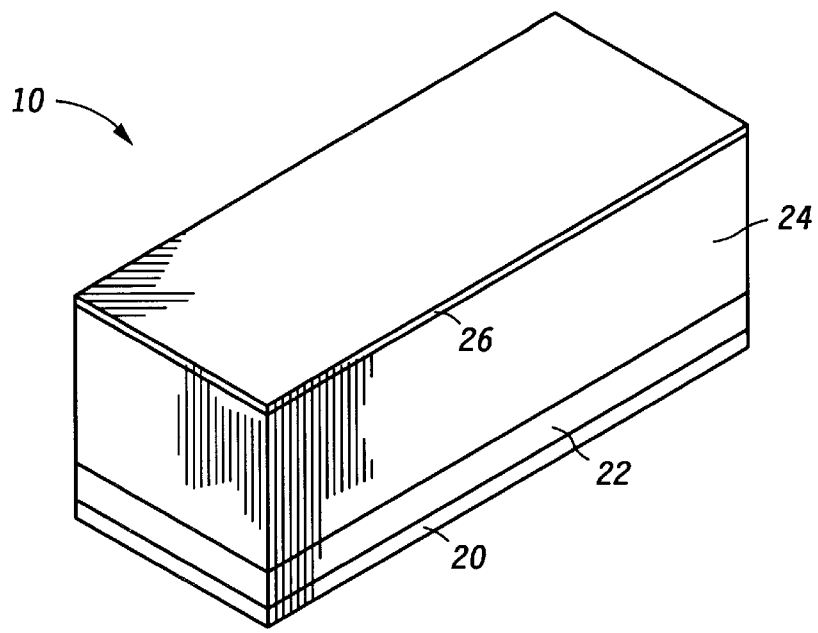
FIGS. 1–3 illustrate, in three dimensional perspective drawings, three prior art interconnect structures.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

Generally, the present invention is a method for forming an improved composite-metallic interconnect structure for use in integrated circuits (ICs). First, a semiconductor wafer is placed within a processing chamber where aluminum (Al), or an alloy thereof, is deposited onto a top surface of the wafer. The wafer is then placed into another processing chamber which contains a titanium (Ti) sputter target, wherein the titanium target is coated with a thin layer of titanium nitride (TiN). An argon (Ar) plasma environment is then used to sputter a portion or all of the titanium nitride (TiN) layer off of the titanium (Ti) sputter target to form an Argon Uniquely Sputtered Titanium Nitride (AUSTiN) layer over the aluminum surface. This AUSTiN layer, also referred to as $TiN_x$, has a graded profile of nitrogen through the thickness, wherein the nitrogen concentration near the aluminum is higher than the nitrogen concentration away from the interface to the aluminum. This specific nitrogen profile/gradient will be subsequently explained hereinafter.

After formation of this AUSTiN layer, the argon (Ar) plasma is then exposed to a nitrogen containing gas (e.g., $N_2$) to create a nitrogen/argon plasma whereby subsequent sputtering from the titanium target will produce a near-stoichiometric titanium nitride (TiN) and/or stoichiometric titanium nitride (TiN). This near-stoichiometric titanium nitride (TiN) and/or stoichiometric titanium nitride (TiN) will be deposited on top of the AUSTiN layer. While forming this near-stoichiometric titanium nitride (TiN) and/or stoichiometric titanium nitride (TiN) layer, the exposure to the nitrogen plasma will also reform the thin titanium nitride (TiN) layer on the titanium (Ti) sputter target which can be sputtered on a subsequent wafer. The resulting structure is an Al—AUSTiN ($TiN_x$)—TiN composite interconnect structure which is improved over the prior art discussed herein below.

The composite interconnect structure taught herein has several advantages over the prior art. First, subsequent via/contact openings formed over this interconnect structure to make electrical contact to this interconnect structure will not require an additional titanium (Ti) and/or titanium nitride (TiN) barrier layer to be deposited in large aspect ratio vias/contacts as is the case for the prior art of FIG. 1. In addition, the embodiments taught herein utilize a titanium target whereby a composite titanium nitride (TiN) target is not needed. Since a composite titanium nitride (TiN) target is not utilized, particle counts in the TiN processing chamber can be reduced and the nitrogen (N) concentration of the titanium nitride (TiN) layer can be more accurately controlled. In addition, the final interconnect structure taught herein comprises little or no titanium whereby adverse reaction with $WF_6$ (used to form overlying tungsten (W) plugs) has been reduced or eliminated.

The interconnect structure taught herein will not form or will reduce the formation of aluminum nitride (AlN) whereby via/contact resistance will be improved. Also, the interconnect structure taught herein will reduce or prevent the formation of titanium aluminide ($Al_3Ti$) whereby electromigration can be improved by a factor of three or more, as is shown by experimental data. In addition, since the process taught herein only requires sputtering from a nitrided titanium target and from an aluminum target (i.e., only two process chambers are needed for the entire composite interconnect structure) wafer handling can be reduced whereby less wafer defectivity can be achieved. In addition, by utilizing fewer chambers, higher deposition system throughput can be achieved than the prior art solutions taught herein. Analytical data has also shown that the film stress of the interconnect structure taught herein is improved over the prior art and that the via/contact resistance of the structure taught herein has been improved. Therefore, the interconnect structure taught herein is an improved solution over the prior art embodiments previously discussed with respect to FIGS. 1–3.

Figure 4:
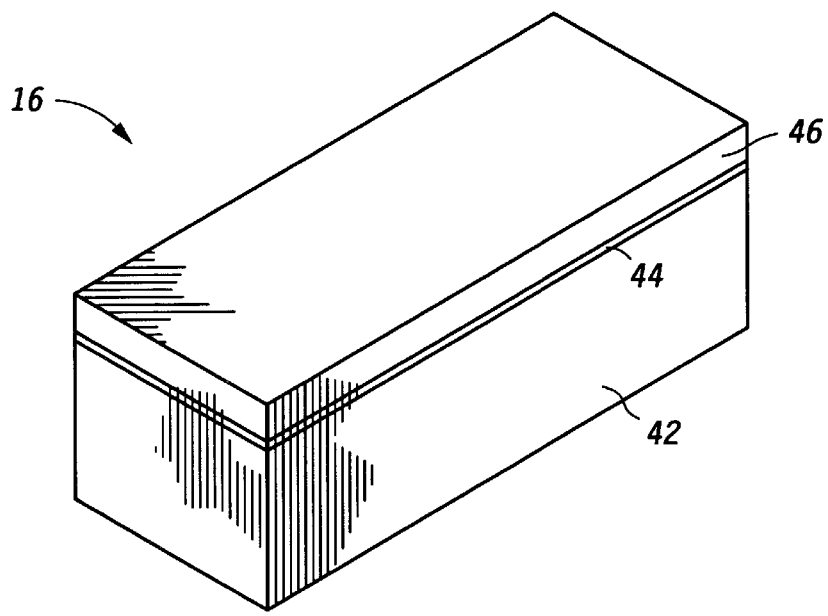
FIG. 4 illustrates, in a three dimensional perspective view, a new interconnect structure in accordance with the present invention.
Figure 5:
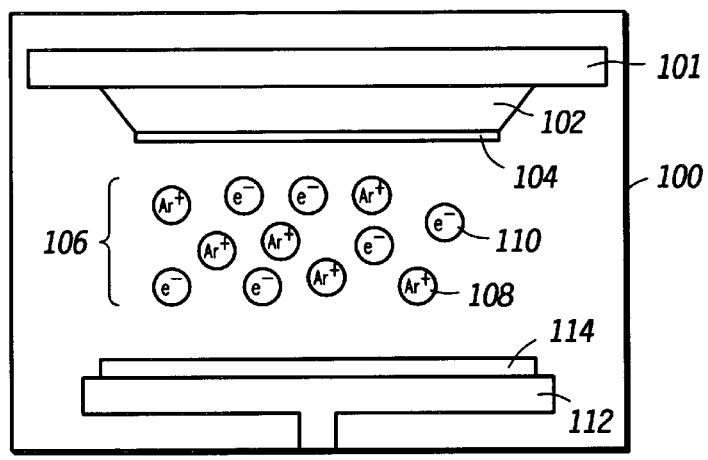
FIGS. 5–7 illustrate, in cross-sectional diagrams, a time sequential illustration of a processing chamber used to form the structure illustrated in FIG. 4 in accordance with the present invention.
Figure 6:
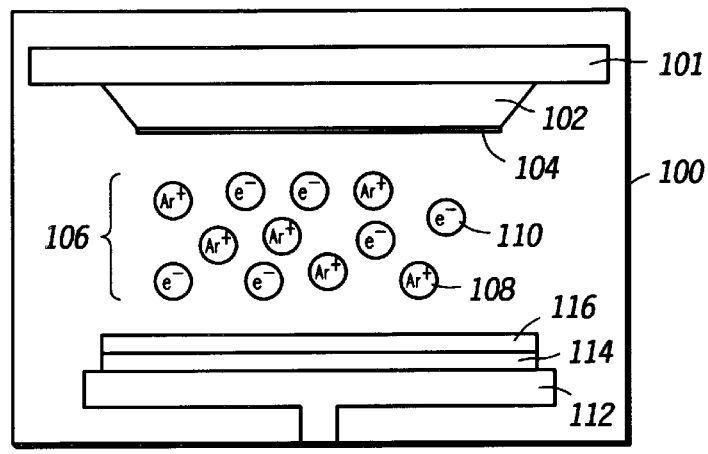
Figure 7:
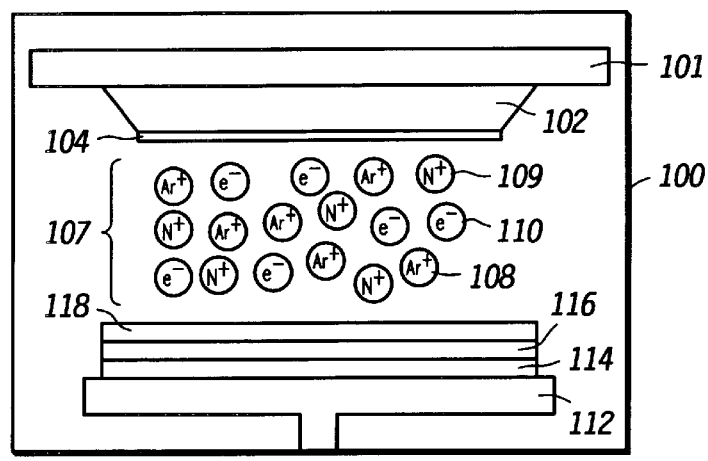

FIG. 4 illustrates the final structure formed by the process as taught in subsequent FIGS. 5–7. FIG. 4 illustrates that an aluminum (Al) layer 42 is first deposited over a dielectric layer or barrier material (not illustrated). It should be noted that the aluminum layer 42 is preferably an aluminum alloy, such as an aluminum copper (Al—Cu) layer wherein the copper comprises between 0.5% to 2.0% of the composition. In yet another form, the layer 42 can be aluminum-copper-silicon (Al—Cu—Si) layer, an aluminum-silicon (Al—Si) layer, or a similar metallic material or composites thereof. The aluminum layer 42 is typically deposited to a thickness of between 4,000 angstroms and 7,000 angstroms with roughly 5,500 angstroms being a preferred thickness. It is important to note that the aluminum may be deposited over previously formed barrier materials such as Ti and/or TiN. Other refractory metals, such as tantalum (Ta), may be used in place of Ti herein.

After formation of the aluminum (Al) layer 42, an <u>A</u>rgon <u>U</u>niquely <u>S</u>puttered <u>Ti</u>tanium <u>N</u>itride (AUSTiN) layer 44 is formed. The details of the chemical composition of this layer 44 are discussed subsequently with respect to FIGS. 8–10. Generally, the layer 44 will contain a greater nitrogen (N) concentration at the surface of the aluminum layer 42 and a lesser nitrogen concentration near a top portion of the layer 44 with a contiguous nitrogen gradient therebetween. This nitrogen distribution/gradient through the layer 44 is accomplished by the sputtering process illustrated in FIGS. 5–7. In general, layer 44 may be chemically identified as $TiN_x$. The thickness of the layer 44 is typically between 20 angstroms and 150 angstroms with less than 80 angstroms being optimal.

After formation of the AUSTiN layer 44, a nearly-stoichiometric titanium nitride (TiN) and/or stoichiometric titanium nitride (TiN) layer 46 is deposited onto layer 44. The layer 46 typically ranges in thickness between 600 angstroms and 1,000 angstroms, but is preferably formed at roughly 800 angstroms in thickness. The layer 46 is utilized as an etch stop layer for subsequently formed vias/contacts and as an anti-reflective coating (ARC) for photo-lithographic processing.

FIGS. 5–7 illustrate a specific method for forming the AUSTiN layer 44 and the titanium nitride layer 46 of FIG. 4 in situ in the same deposition/sputtering chamber. In FIGS. 5–7, the AUSTiN layer 116 is analogous to the $TiN_x$ layer 44 of FIG. 4, and the TiN layer 118 is analogous to the TiN layer 46 of FIG. 4.

In FIG. 5, a deposition chamber 100 is illustrated. The deposition chamber 100 contains a backing plate 101 that is bonded to a titanium (Ti) target 102. Due to previous processing of previous wafers, a thin titanium nitride layer 104 is resident on an exposed surface of the titanium target 102. The chamber 100 also contains a pedestal 112 which is used for supporting a semiconductor wafer 114. The wafer 114 can either be clamped or unclamped to the pedestal 112, and the wafer 114 contains an aluminum layer formed thereon. In addition, the pedestal 112 can contain either heating and/or cooling means for controlling the temperature of the wafer 114 during deposition/sputtering.

A robotic arm (not specifically illustrated in FIGS. 5–7) will place the wafer 114 onto the pedestal 112. After wafer placement has occurred by the robotic arm, a plasma 106 is created within the process chamber 100. Plasma 106 consists of energized argon ions ($Ar^+$) 108 and energized electrons ($e^-$) 110. A power source is utilized to create a voltage potential between the target 102 and the plasma 106. This difference in potential, along with the energized state of the ions 108, results in material being sputtered from the layer 104 and depositing on top of the wafer 114 to form the layer 116.

FIG. 6 illustrates that the sputtering process continues for a period of time (for exact time periods, see FIG. 11 and associated text) until material from the target TiN layer 104 is removed from the target surface and deposit onto the wafer 114 to incrementally form layer 116. Therefore, the sputtering process eventually results in an AUSTiN layer 116 being formed on top of the wafer 114. As is illustrated in FIG. 6, the argon (Ar) plasma 106 results in material being removed from the layer 104 whereby the layer 104 on the target 102 is either thinned or entirely removed from the target 102. As the layer 104 is removed from the target 102, the incremental composition of the layer 116 will be more titanium-rich and more nitrogen-poor. In other words, bottom portions of the layer 116 have a higher N concentration than upper portions of the layer 116 due to the erosion of the layer 104 as a function of sputtering time. After a predetermined time period, whereby a predetermined thickness of layer 116 is achieved, processing continues as shown in FIG. 7.

FIG. 7 illustrates that a reactive gas, preferably nitrogen ($N_2$), is provided to the processing environment internal to the process chamber 100. Due to the providing of the nitrogen gas, the Ar plasma 106 of FIG. 6 will change to a Ar—N plasma 107 in FIG. 7. Therefore, the plasma 107 will not only comprise energized argon ions ($Ar^+$), but will also comprise energized nitrogen ions ($N^+$). As with the plasma 106, the plasma 107 also contains the energized electrons ($e^-$) 110.

The nitrogen ions 109, resident in the plasma 107 of FIG. 7, result in subsequent material deposition onto the wafer 114 being stoichiometric or near stoichiometric titanium nitride (TiN). Therefore, a titanium nitride layer 118 is incrementally deposited on top of the AUSTiN layer 116 over time. As is also illustrated in FIG. 7, the presence of the nitrogen ions 109 within the plasma 107 will result in the reformation of the titanium nitride layer 104 on an exposed surface of the titanium (Ti) target 102. Therefore, the wafer 114, which now has an aluminum-AUSTiN ($TiN_x$)—TiN interconnect layer formed thereon, can be robotically removed from the chamber 100. After removal of this wafer, a new wafer is placed into the chamber whereby processing can once again begin for this new wafer with FIG. 5 and continue through FIG. 7 in an iterative manner for each new wafer.

Figure 8:
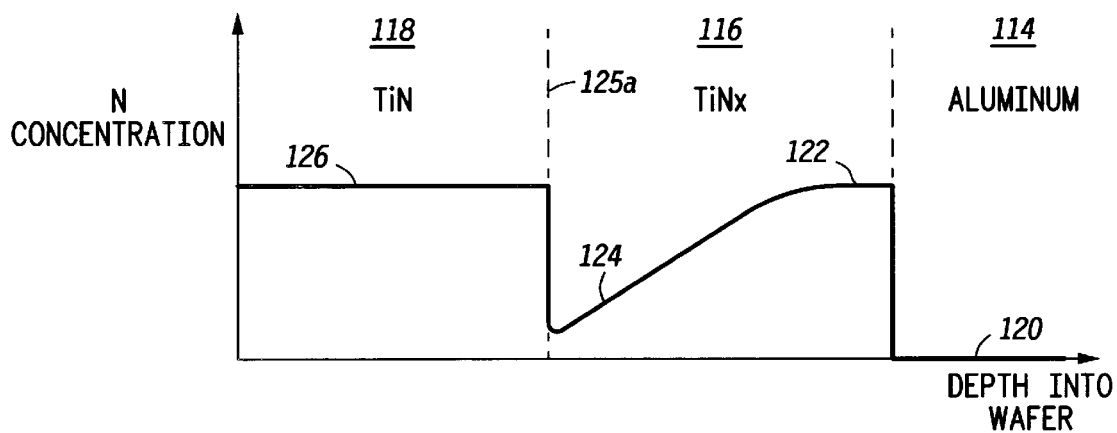
FIGS. 8–10 illustrate, in XY plots, three different embodiments wherein each of the three different embodiments have a different nitrogen composition in accordance with the present invention.
Figure 9:
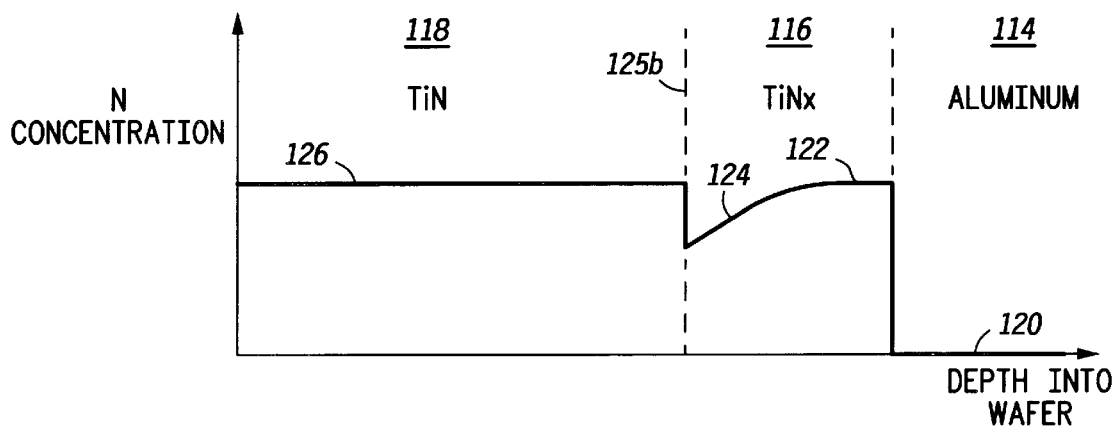
Figure 10:
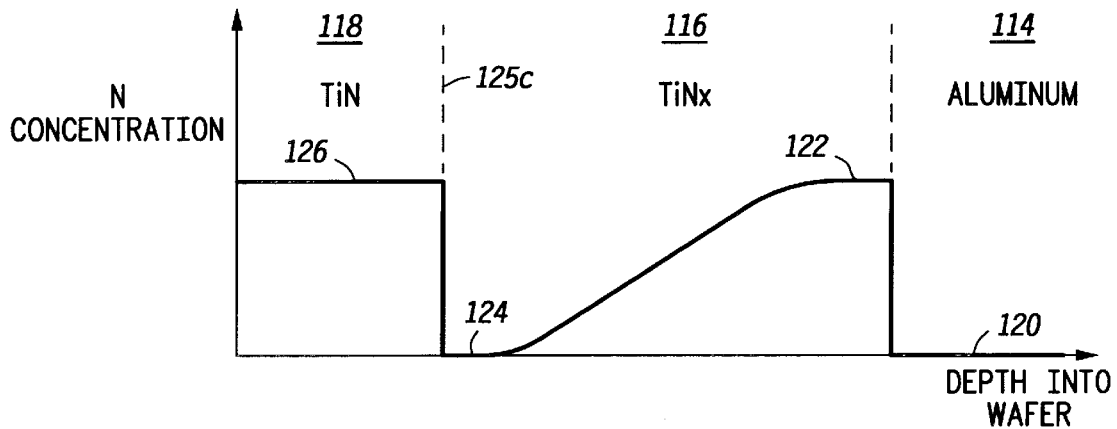

FIGS. 8–10 illustrate three different chemical composition embodiments which can occur for the layers 114–118 on the wafer illustrated in FIG. 7. FIGS. 8–10 illustrate the wafer of FIG. 7 cross-sectioned vertically from the top of layer 118 to the top portion of the substrate 114 which includes an aluminum layer. FIGS. 8–10 illustrate the depth into the wafer versus the nitrogen concentration through the TiN layer 118, AUSTiN layer 116, and the top portion of the wafer 114 where aluminum (Al) was deposited.

FIG. 8 illustrates one particular embodiment of the present invention. FIG. 8 illustrates that the aluminum layer, located at a top portion of the silicon wafer 114, has nearly no nitrogen concentration or no nitrogen concentration whatsoever. This lack of significant nitrogen concentration is depicted by a concentration 120. At the interface between the aluminum 114 and the AUSTiN layer 116, the nitrogen concentration rises to a near stoichiometric level 122. In other words, when deposition/sputtering initially begins in FIG. 5, the material initially sputtered from layer 104 is near stoichiometric titanium nitride (TiN) such that the bottom portion of the layer 116 of FIG. 6 has a high concentration of nitrogen atoms (N). This high concentration of nitrogen atoms is illustrated as level 122 in FIG. 8.

As the argon plasma 106 continues to sputter material from the layer 104 of the target 102, the layer 104 is thinned over time. As the layer 104 of FIG. 6 begins to thin and the layer 116 of FIG. 6 begins to thicken, the nitrogen concentration of the layer 116 will begin to reduce as more Ti from the target 102 is incrementally consumed. This reduced level of nitrogen concentration and titanium-rich $TiN_x$ portion of layer 116 is illustrated by a level 124 of FIG. 8. FIG. 8 clearly illustrates that the nitrogen introduction step of FIG. 7 is commenced before the entire layer 104 of the target 102 is removed. Therefore, FIG. 8 illustrates that there is no point at which pure titanium from target 102 is deposited as a portion of the layer 116 (unlike FIG. 10 which is another embodiment). In FIG. 8, before the target 102 is completely depleted of the nitrogen content of layer 104, the argon-nitrogen plasma 107 of FIG. 7 is generated to deposited near stoichiometric or stoichiometric titanium nitride (TiN) having a higher nitrogen concentration 126 as illustrated in FIG. 8. Usually, the levels 122 and 126 are nearly equal. Therefore, an AUSTiN layer having an initial nitrogen concentration 122 which is near stoichiometric is deposited such that the nitrogen concentration will reduce as the thickness of the film 116 increases.

FIG. 9 illustrates an alternate embodiment than that illustrated in FIG. 8. FIG. 9 still illustrates that the aluminum top portion of the substrate 114 contains a very low level of nitrogen 120. FIG. 9 then illustrates that the deposition begun in FIG. 5 and completed in FIG. 6 is performed for a very short time period. Because the time period of AUSTiN deposition of FIG. 9 is very brief, the graded profile of the nitrogen concentration through layer 116 is less severe in FIG. 9 and the thickness of the layer 116 of FIG. 6 is thinner (roughly less than 50 angstroms). In FIG. 7, the argon (Ar) and nitrogen (N) plasma is then generated whereby the layer 118, having a nitrogen concentration of 126, is formed in the left-hand portion of FIG. 9.

It is important to note that the argon-nitrogen plasma 107 of FIG. 7 may interact with the atomic titanium (Ti) at a surface portion of the layer 116 when the plasma 107 is first created.

Therefore, the nitrogen ions 109 in FIG. 7 may actually increase the nitrogen concentration of layer 116, thus increasing the titanium nitride concentration of the upper portion of the layer 116 as time progresses. In fact, it may be possible for the layer 116 of FIG. 9, for example, to be entirely converted to stoichiometric or near stoichiometric titanium nitride (TiN) due to the presence of the nitrogen ions 109 at the interface 125b illustrated in FIG. 9, even if the layer 116 is initially deposited in a non-stoichiometric form. Furthermore, when the semiconductor device (wafer) is subjected to a metal anneal process, as is conventional in the semiconductor arts, the interface between the nitrogen poor region and the nitrogen rich region becomes less distinct. However, analysis has shown that some titanium-rich regions will typically be detected near the interface between the AUSTiN layer 116 and the titanium nitride layer 118 when longer sputter times (greater than roughly 20–30 kW-seconds) are used for the layer 116.

FIG. 10 illustrates yet another embodiment of the AUSTiN layer as taught herein. FIG. 10 illustrates, once again, the aluminum layer on a top portion of the substrate 114 contains no or a very small amount of nitrogen 120. If the deposition time of FIG. 6 is significantly long (greater than roughly 20 to 30 seconds at 1 kW as deposited in an Applied Materials Endura) and/or the power of the plasma 106 is high (greater than roughly 5 kW on an Applied Materials Endura), then the layer 104 of FIG. 6 will most likely be entirely removed and pure titanium will begin to deposit as a top portion of the layer 116. This is illustrated in FIG. 10 whereby the nitrogen composition of a lower portion of the layer 116 is high as illustrated by level 122, whereas a level 124 of FIG. 10 clearly illustrates that no nitrogen is present. Therefore, at level 124 of FIG. 10, pure titanium (Ti) is being deposited from the target 102 as an upper portion of the layer 116 in FIG. 6. In this region 124 of FIG. 10, the layer 104 of FIG. 6 has been entirely removed and pure titanium is now being sputtered from the target 102. FIG. 10 then illustrates that the plasma 107 is generated whereby the layer 118 is formed over the top of the AUSTiN layer 116 due to an argon-nitrogen plasma. As noted previously, some of the titanium-rich region 124 of FIG. 10 will be consumed by the nitrogen ions present within the plasma 107 in FIG. 7. Therefore, FIGS. 8–10 illustrate that various profiles and/or concentrations of the AUSTiN layer 116 can be achieved by changing sputter times and sputter energies of the plasmas 106 and 107.

Figure 11:
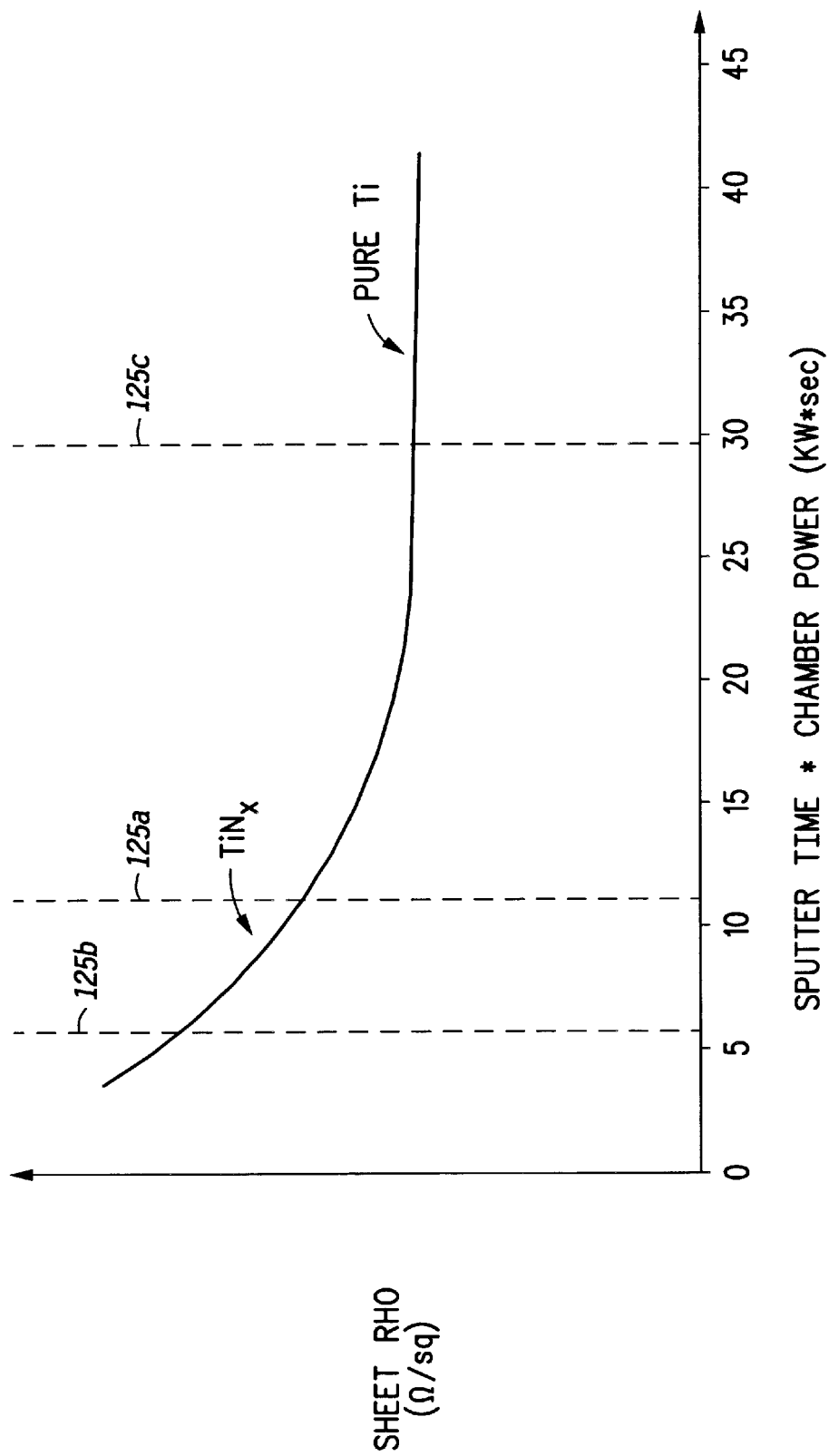
FIG. 11 illustrates, in an XY plot, the incremental sheet resistance of deposited material for layer 116 versus sputtering time in accordance with the present invention.

FIG. 11 illustrates a plot of sputter time versus the sheet resistance of the incrementally sputtered material. FIG. 11 clearly illustrates that the initial material deposited in the first 5 seconds of the sputtering process illustrated in FIGS. 5–6 is more resistive than titanium. In other words, the material deposited between 0–5 seconds in FIG. 11 is titanium that is heavily nitrogen-laden or is near stoichiometric titanium nitride (TiN). As time increases to between 10 seconds and 15 seconds in FIG. 11, the layer 104 of FIG. 6 is further eroded whereby the nitrogen concentration of the material deposited onto incremental portions of layer 116 reduces the nitrogen concentration. This reduction in nitrogen concentration as sputter time increases (i.e., the removal of the layer 104 of FIG. 6) is clear given the increase in conductivity over time in FIG. 11. The increase in conductivity to the right-hand side of FIG. 11 is due to the fact that layer 104 is thinning and more pure Ti is incrementally being deposited. Eventually, after roughly 20 seconds of sputtering at 1 kW in an Applied Materials Endura, all or nearly all of the layer 104 has been removed in FIG. 6 and pure titanium (Ti) begins to be sputtered as incremental upper portions of the layer 116 as clearly illustrated in FIG. 10. All of FIG. 11 contains data collected from an Applied Materials Endura PVD system operating at roughly 1 kW of power.

Therefore, if one were to sputter for roughly 5 seconds using the process of FIG. 6, FIG. 11 illustrates that the structure of FIG. 9 would form. FIG. 11 then illustrates if one were to sputter for roughly 10–12 seconds in the chamber of FIG. 6, then the resulting compositions of FIG. 8 would be created. Finally, FIG. 11 illustrates that if roughly 30 seconds of sputtering were performed by the process constraints illustrated in FIG. 6, the resulting material composition illustrated in FIG. 10 would result for the interconnect structure.

It is important to note that the greater the power of the processing chamber 100, the less time it will take to entirely consume the layer 104 of FIG. 6. Inversely, the lower the power, the longer time it will take to completely erode the layer 104 off of the target 102 in FIG. 6. In general, the embodiment illustrated in FIG. 8 herein can be formed by using a power*time product somewhere between 5,000 kW-seconds and 15,000 kW-seconds (kW*sec). Therefore, FIG. 11 not only illustrates the amount of sputter or burn time necessary to arrive at the results of FIG. 8–10, but also illustrates how power and time can be manipulated to create different titanium and nitrogen profiles in the AUSTiN layer 116 formed using the process of FIGS. 5–7.

Figure 2:
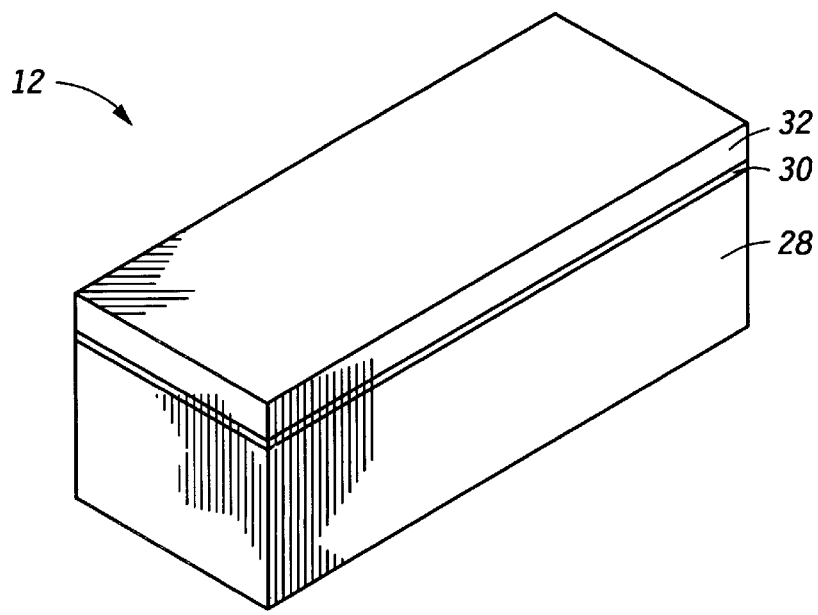
Figure 12:
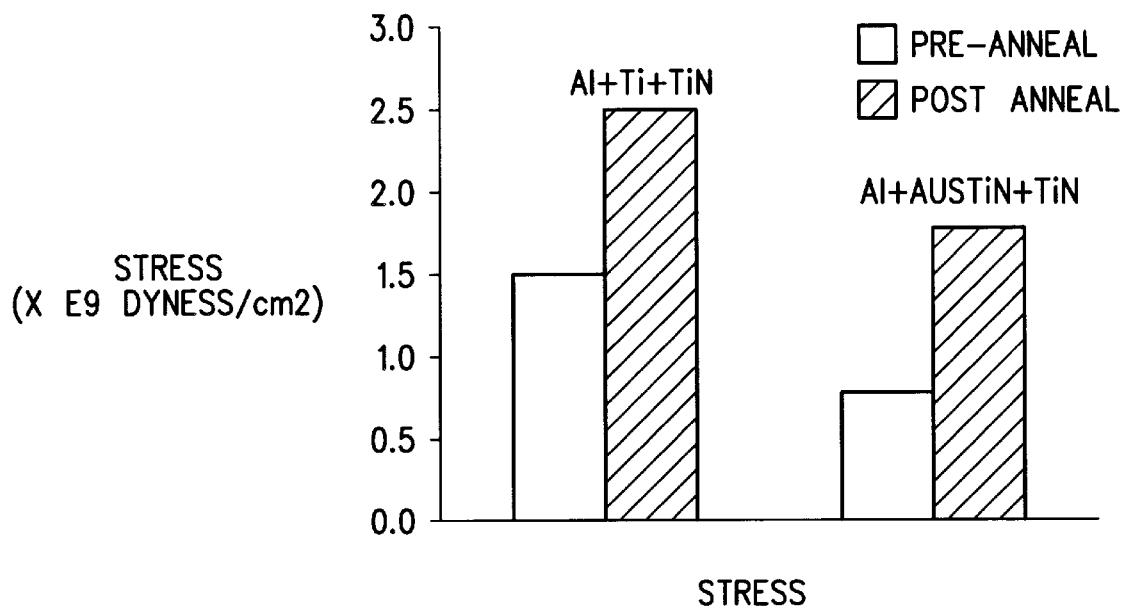
FIG. 12 illustrates, in a bar graph, the stress data for the device of FIG. 2 as compared to the stress data for the device of FIG. 4 in accordance with the present invention.

FIG. 12 is a bar graph plot which illustrates that the interconnect of FIG. 4 herein has reduced film stress when compared to the prior art embodiment of FIG. 2. A left-hand portion of FIG. 12 illustrates the pre-anneal and post-anneal stress levels of the embodiment of FIG. 2. A right-hand portion of FIG. 12 illustrates the pre-anneal and post-anneal stress levels of the novel structure of FIG. 4. As can be clearly seen from FIG. 12, the use of the process taught herein in FIGS. 4–11 can reduce the level of film stress associated with interconnect layers.

Figure 13:
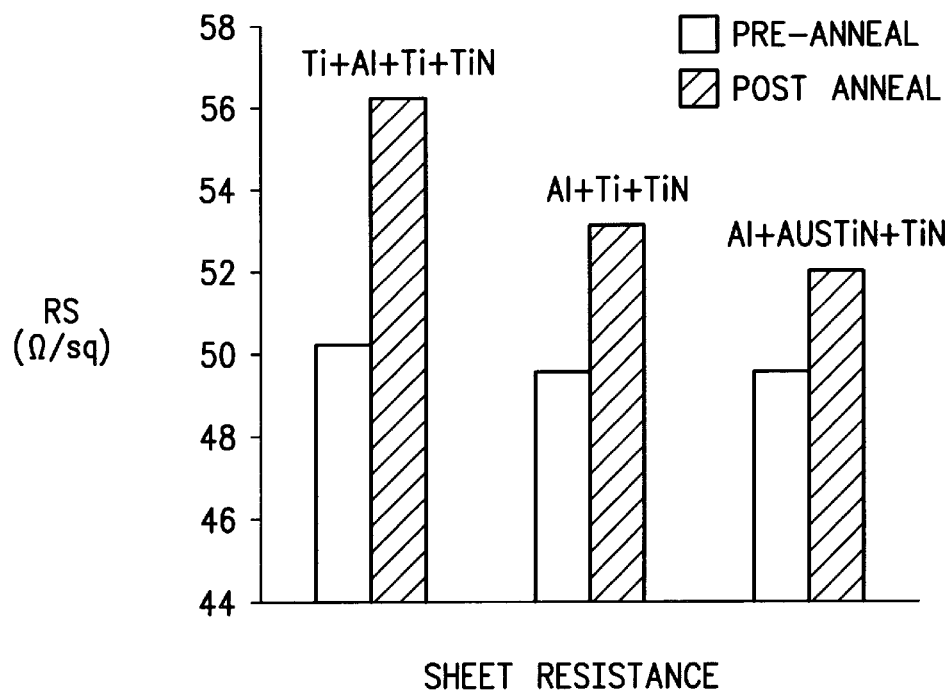
FIG. 13 illustrates, in a bar graph, the sheet resistance of various prior art devices as compared to the structure of FIG. 4 in accordance with the present invention.

FIG. 13 illustrates, in a bar graph plot, the sheet resistance measurements for various prior art interconnect structures as compared to the novel interconnect structure of FIG. 4. A left-hand portion of FIG. 13 illustrates higher sheet resistance for both a pre-anneal structure and a post-anneal structure comprising of titanium under aluminum wherein the aluminum is capped with a titanium and titanium nitride composite. In addition, a middle portion of FIG. 13 illustrates the embodiment of FIG. 2 wherein FIG. 13 clearly illustrates that the sheet resistance of both this pre-anneal and post-anneal structure has slightly decreased from that illustrated in the left-hand portion of FIG. 13. FIG. 13 then illustrates, in a right-hand portion of FIG. 13, the sheet resistance of the novel structure illustrated in FIG. 4. As can be readily seen from FIG. 13, the sheet resistance of the metal interconnect of FIG. 4 is greatly improved over the prior art solutions illustrated in FIGS. 2–3 where Ti is in contact with Al and is annealed to form $Al_3Ti$.

Figure 14:
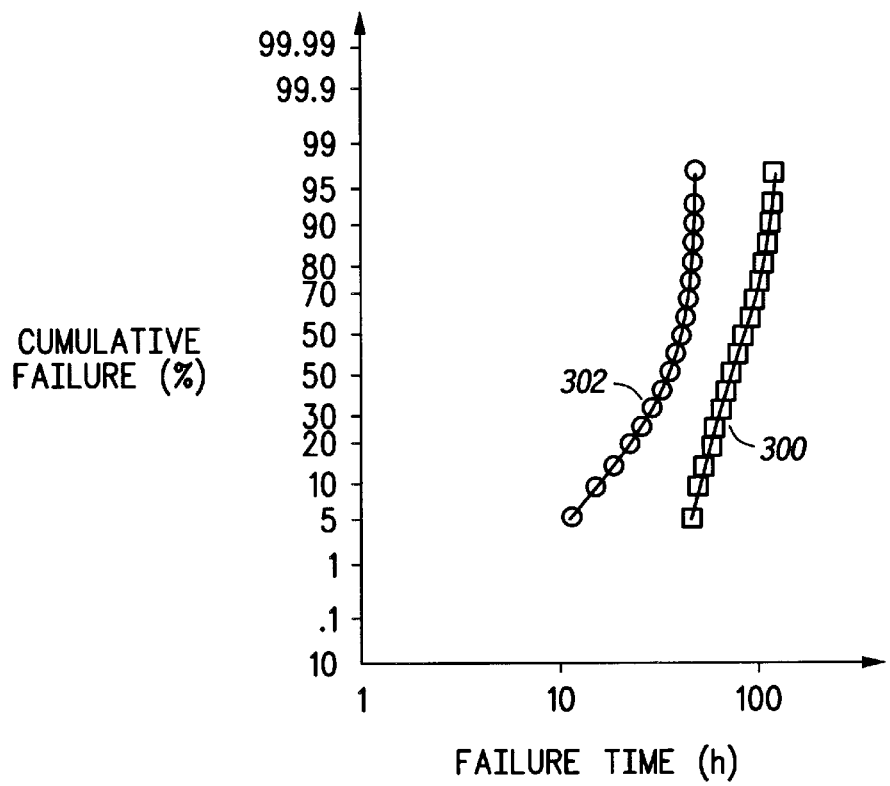
FIG. 14 illustrates, in a logarithmic XY plot, the improved electromigration resistance which is present within the device of FIG. 4 in accordance with the present invention.

FIG. 14 illustrates electromigration data 302 and 300. Electromigration data 302 is for the prior art structure of FIG. 2 which is typically preferred over the FIGS. 1 and 3. The electromigration data 300 of FIG. 14 is for the novel structure of FIG. 4. As can be easily seen by the magnitude and the slopes of the curves 302 and 300, the electromigration of the interconnect structure of FIG. 4 is greatly improved over the prior art structure of FIG. 2. It has been shown experimentally that electromigration improvement of at least three times has been achieved using the structure of FIG. 4 as opposed to other prior art structures. Measurements of the structure of FIG. 2 and measurements of the structure of FIG. 4 taken under identical conditions have resulted in a mean time to failure (MTF) for the structure of FIG. 2 of roughly 31 hours with a standard deviation of 0.45 and a mean time to failure (MTF) of the structure of FIG. 4 being greater than or equal to 63 hours with a standard deviation of 0.32. The maximum current for electromigration characterization for the structure of FIG. 2 is roughly 242 microamperes (MA) whereas the interconnect of FIG. 4 formed with identical geometries and under identical stress conditions results in a maximum electromigration current of roughly 943 microamperes (MA). Therefore, in summary, the interconnect structure of FIG. 4 has greatly improved electromigration properties over those of the prior arts as illustrated in FIGS. 1–3.

Figure 3:
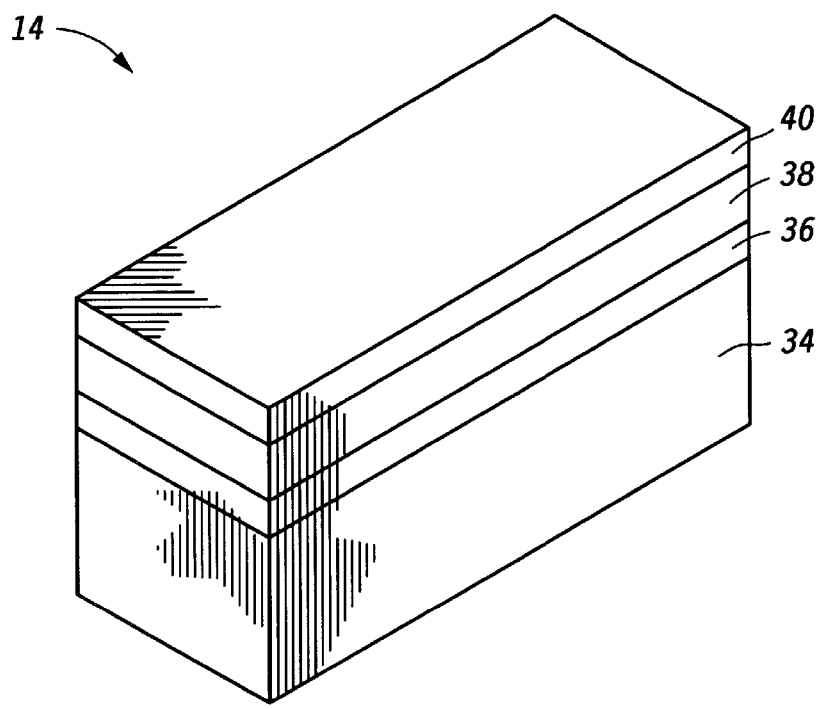
Figure 15:
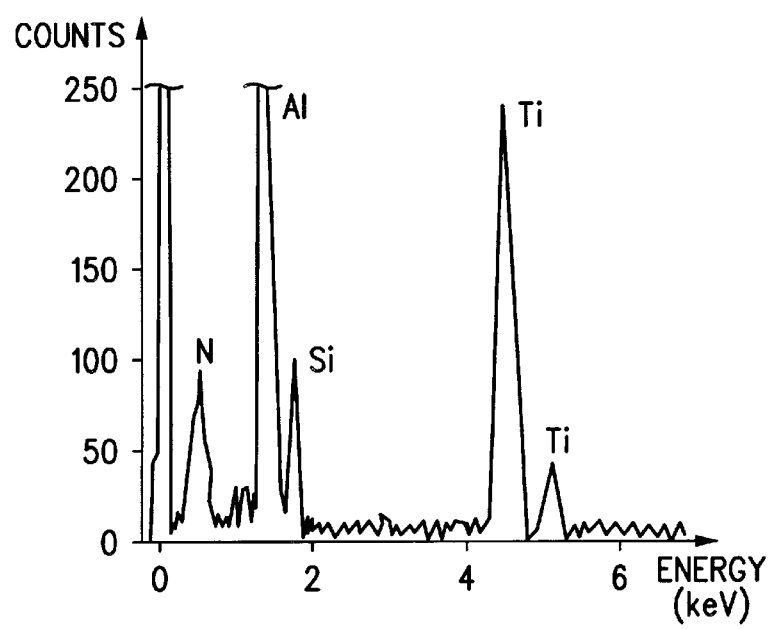
FIGS. 15 and 16 illustrates, in XY plots, the chemical composition of the prior art aluminum interface as opposed to the aluminum interface in accordance with the present invention.
Figure 16:
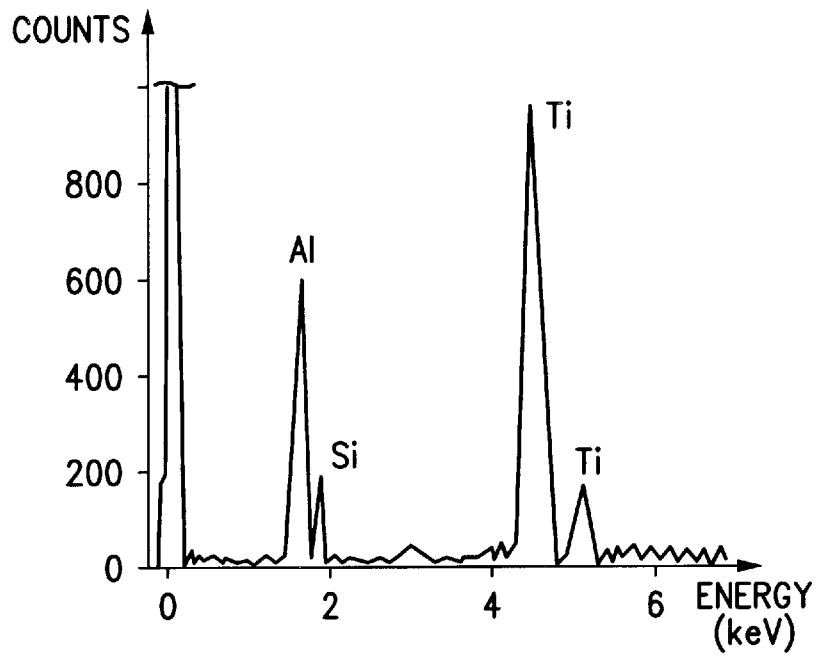

FIGS. 15 and 16 are used to illustrate that the structure of FIG. 4 does not suffer from the adverse formation of aluminum nitride (AlN) as does the structure of FIG. 3. FIG. 15 illustrates energy dispersion spectrometry (EDS) data for the interface between layer 36 and layer 34 of FIG. 3. FIG. 15 clearly illustrates the presence of nitrogen and the formation of an aluminum nitride (AlN) layer at the interface between layers 36 and 34 in FIG. 3. On the other hand, FIG. 16 illustrates an EDS analysis performed on the interface between layers 44 and 42 of FIG. 4. FIG. 16 clearly illustrates that there is no highly-resistive aluminum nitride (AlN) formation at the interface between layers 44 and 42 in FIG. 4.

Figure 17:
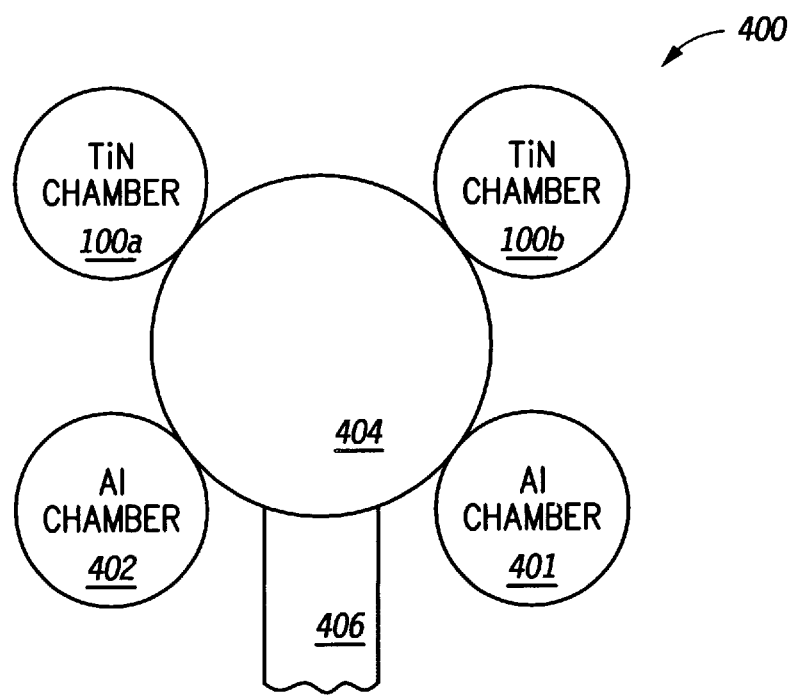
FIG. 17 illustrates, in a top perspective view, a cluster deposition tool in accordance with the present invention.

FIG. 17 illustrates a cluster deposition tool 400 such as an Applied Materials Endura PVD sputtering system. Wafers enter into a wafer transfer chamber 404 through an chamber entry 406. Once a wafer is within the transfer chamber 404, robotic control places the wafer within one of the two aluminum (Al) sputtering chambers 401 or 402. After one of the chambers 401 or 402 is used to deposit the layer of aluminum 42 of FIG. 4, the wafer is robotically transferred through the transfer chamber 404 to one of the chambers 100a or 100b of FIG. 17. Once the wafer is placed within a chamber 100a or 100b, the process of FIGS. 5–7 is performed to form the layers 44 and 46 on top of the aluminum layer 42. Once the process of FIGS. 5–7 is completed in one of the chambers 100a or 100b, the wafer is then removed from the deposition system 400 through the transfer chamber 404 and the entry 406 and subsequent wafers may be processed.

The structure and process taught herein by FIGS. 417 is greatly improved over the prior arts as discussed by FIGS. 1–3. Using the structure of FIG. 4 taught herein, overlying vias which contact to the interconnect structure of FIG. 4 do not need a barrier deposition process to be as aggressive as does the prior art of FIG. 1. Note that titanium and/or titanium nitride still needs to be deposited on a sidewall of an overlying via/contact above the structure of FIG. 4 in order to function as a glue layer for W or a like material. However, these sidewall glue layers need not be as aggressively deposited in order to form a barrier at a bottom portion of the via/contact as in FIG. 1. Therefore, subsequent via diameters can be further reduced in size without dangerously reducing the glue step coverage as is the case in FIG. 1.

In addition, the process taught herein with respect to FIGS. 5–7 utilizes a titanium target 102. Therefore, composite titanium nitride (TiN) targets are avoided by the process taught herein whereby particle counts are improved and the nitrogen concentration of the resulting titanium nitride films can be controlled to a higher degree of uniformity.

In addition, the structure of FIG. 4 has eliminated a pure titanium (Ti) layer whereby subsequent $WF_6$ processing to form tungsten (W) plugs or tungsten material cannot adversely interact with titanium layers, as is the case for the prior art structures of FIGS. 2 and 3.

As discussed with respect to FIGS. 15–16, the interconnect structure of FIG. 4 either entirely eliminates or substantially suppresses the formation of aluminum nitride (AlN). This suppression of aluminum nitride formation is advantageous since aluminum nitride is a highly resistive layer whereby AlN presence adversely affects sheet resistance and via/contact resistance. In addition, since titanium is not in direct contact with aluminum at any point with the structure of FIG. 4, the formation of titanium aluminide ($Al_3Ti$) is reduced or eliminated. Therefore, electromigration properties of the device of FIG. 4 are greatly improved over the device of FIG. 2. As was experimentally shown, the electromigration data for the structure of FIG. 4 has been improved over prior art structures of at least FIG. 2 by at least a factor of three (see FIG. 14 herein).

In addition, no shutter processing or dummy wafer processing is required in the process of FIGS. 5–7. Therefore, throughput is improved using the process of FIGS. 5–7. In addition, cost of ownership and throughput are improved since wafer handling and the number of chambers used to process the interconnect structure of FIG. 4 are reduced over the prior art embodiments. Data has shown that throughput can be increased by a factor of roughly 50% utilizing the processing taught herein by FIGS. 4–17. In addition, less wafer handling results in less defectivity in wafer materials, and the deposition system of FIG. 17 contains redundant chambers (e.g., two nearly-identical Al chambers and two nearly identical AUSTiN-TiN chambers in a PVD cluster deposition system). Redundant chambers are advantageous since chambers 100*a* and 402, for example, can be utilized for processing while chambers 100*b* and 401 can be undergoing preventative maintenance or upgrades without completely stopping the throughput of the system 400. As clearly illustrated in FIGS. 12–13, the film stress of the structure of FIG. 4 is greatly reduced over the prior art interconnect structures, and the sheet resistance and via/contact resistance of the material in FIG. 4 are improved over the prior art as well.

Although the invention has been described and illustrated with reference to specific embodiments, it is not intended that the invention be limited to those illustrative embodiments. Those skilled in the art will recognize that modifications and variations may be made without departing from the spirit and scope of the invention. For example, the titanium nitride on the sputtering target taught herein may be reformed after wafer sputtering by re-nitriding the target from a dummy wafer or a chamber shutter. Therefore, it is intended that this invention encompass all of the variations and modifications as fall within the scope of the appended claims.

What is claimed is:

1. A method for forming a semiconductor structure, the method comprising the steps of:

providing a semiconductor substrate having a region comprising a first metal;

providing a processing chamber;

providing, in the processing chamber, a target having a first layer comprising a first target metal composition and a second layer having a second target metal composition;

placing the semiconductor substrate in the processing chamber;

creating an inert gas plasma in the processing chamber;

forming a first target metal region over the semiconductor substrate;

introducing nitrogen into the processing chamber in situ with the inert gas plasma; and forming a second target metal region over the semiconductor substrate and forming a new first layer on the target by reacting the nitrogen with the second layer.

2. The method of claim 1, wherein the step of providing a target further comprises the target being a refractory metal, wherein the first layer is a refractory metal-nitrogen composition and the second layer is substantially comprises the refractory metal.

3. The method of claim 2, wherein the step of providing a target further comprises the refractory metal comprising titanium.

4. The method of claim 2, wherein the step of providing a target further comprises the refractory metal comprising tantalum.

5. The method of claim 1, wherein the step of forming a first target metal region further comprises the first target metal region being formed by sputtering the first layer directly on the semiconductor substrate.

6. The method of claim 5, wherein the step of forming a first target metal region further comprises the first target metal region having a greater nitrogen content at a first point near the semiconductor substrate than at a second point which is further away from the semiconductor substrate than the first point.

7. The method of claim 6, wherein the step of forming a second target metal region further comprises the second target metal region's nitrogen composition being substantially stoichiometric.

8. The method of claim 5, wherein the step of forming a first target metal region further comprises the first target metal region being a graded metal region, wherein the graded metal region is graded from a substantially stoichiometric nitrogen composition near the semiconductor substrate to being target metal rich.

9. The method of claim 1, wherein the step of forming a second target metal region further comprises the second target metal region's nitrogen composition being substantially stoichiometric.

10. The method of claim 1, wherein:

the step of forming a first target metal region further comprises the first target metal region having a first location and a second location, wherein the first location is closer to the semiconductor substrate than the second location;

the step of forming a second target metal region further comprises the first target metal region having a third location; and wherein a second atomic concentration of nitrogen at the second location is less than a first atomic concentration of nitrogen at the first location and the second atomic concentration of nitrogen is less than a third atomic concentration of nitrogen at the third location.

11. The method of claim 1, wherein the step of forming a first target metal region further comprises the first target metal region being a barrier preventing nitrogen, introduced during the step of introducing nitrogen into the processing chamber, from substantially reacting with the first metal to form compounds containing nitrogen molecules.

12. The method of claim 11, wherein the step of forming a first target metal region further comprises the first metal being aluminum and the nitrogen containing molecule being AlN.

13. The method of claim 1, wherein the step of forming a first target metal region further comprises the first target metal region being a barrier preventing titanium from substantially reacting with the first metal to form compounds containing titanium atoms.

14. The method of claim 13, wherein the step of forming a first target metal region further comprises the first metal being aluminum and the compound containing titanium atoms being $Al_3Ti$.

15. The method of claim 1, wherein the step of forming a first target metal region further comprises the substep of:

sputtering the first target metal region by applying to the processing chamber between 5000 watt-seconds to 15000 watt-seconds.

16. A method of forming a semiconductor interconnect structure comprising the steps of:

providing a processing chamber;

placing a refractory metal target into the processing chamber;

conditioning the refractory metal target to form a nitrided target layer;

providing a semiconductor substrate;

forming a dielectric region over the semiconductor substrate;

forming a first metal region over the dielectric region;

placing the semiconductor substrate in the processing chamber;

introducing an inert gas into the processing chamber;

forming a first nitrided metal region over the first metal region based upon the nitrided target layer;

introducing nitrogen into the processing chamber in situ with the inert gas;

forming a second nitrided metal region over the first nitrided metal region, where the second nitrided metal region is substantially stoichiometric; and reconditioning the nitrided target layer to form a nitrided target layer at substantially as same time as forming the second nitrided metal region.

17. The method of claim 16, wherein the steps forming first and second nitrided metal regions further comprise using sputtered technology to form the first and second nitrided metal regions.

18. The method of claim 17, wherein the steps forming first and second nitrided metal regions further comprise forming the first and second nitrided metal regions as titanium nitride regions.

19. The method of claim 17, wherein the steps forming first and second nitrided metal regions further comprise forming the first and second nitrided metal regions as tantalum nitride regions.

20. The method of claim 16, wherein the steps providing the refractory metal target comprises:

providing a refractory metal target comprising titanium.

21. The method of claim 16, wherein the steps providing the refractory metal target comprises:

providing a refractory metal target comprising tantalum.

* * * * *